United States Patent
Rouse (10) Patent No.: US 7,064,043 B1
(45) Date of Patent: Jun. 20, 2006

(54) WAFER BONDED MOS DECOUPLING CAPACITOR

(75) Inventor: Richard P. Rouse, Santa Clara, CA (US)

(73) Assignee: Texas Instruments Incorporated, Dallas, TX (US)

( * ) Notice: Subject to any disclaimer, the term of this patent is extended or adjusted under 35 U.S.C. 154(b) by 70 days.

(21) Appl. No.: 11/008,007

(22) Filed: Dec. 9, 2004

(51) Int. Cl.
*H01L 21/20* (2006.01)
*H01L 21/8242* (2006.01)

(52) U.S. Cl. ............ 438/396; 438/393; 438/250; 438/239

(58) Field of Classification Search ........ 438/396, 438/393, 394, 253, 250, 239, 240
See application file for complete search history.

(56) References Cited

U.S. PATENT DOCUMENTS

| | | | |
|---|---|---|---|
| 5,640,049 A * | 6/1997 | Rostoker et al. ............ 257/758 |
| 6,222,246 B1 * | 4/2001 | Mak et al. .................. 257/532 |
| 6,806,568 B1 | 10/2004 | Schaper | |
| 6,838,332 B1 * | 1/2005 | Sanchez et al. ............ 438/239 |
| 2002/0094629 A1 * | 7/2002 | Belleville et al. ........... 438/218 |
| 2004/0195694 A1 | 10/2004 | Duncombe et al. | |

* cited by examiner

*Primary Examiner*—Michael Trinh
(74) *Attorney, Agent, or Firm*—Peter K. McLarty; W. James Brady, III; Frederick J. Telecky, Jr.

(57) ABSTRACT

A technique for forming a MOS capacitor (100) that can be utilized as a decoupling capacitor is disclosed. The MOS capacitor (100) is formed separately from the particular circuit device (170) that it is to service. As such, the capacitor (100) and its fabrication process can be optimized in terms of efficiency, etc. The capacitor (100) is fabricated with conductive contacts (162) that allow it to be fused to the device (170) via conductive pads (172) of the device (170). As such, the capacitor (100) and device (170) can be packaged together and valuable semiconductor real estate can be conserved as the capacitor (100) is not formed out of the same substrate as the device (170). The capacitor (100) further includes deep contacts (150, 152) whereon bond pads (180, 182) can be formed that allow electrical connection of the capacitor (100) and device (170) to the outside world.

20 Claims, 7 Drawing Sheets

WAFER BONDED MOS DECOUPLING CAPACITOR

FIELD OF INVENTION

The present invention relates generally to semiconductor devices, and more particularly to fashioning a metal oxide semiconductor (MOS) capacitor that can be operatively coupled to an integrated circuit to serve as a decoupling capacitor.

BACKGROUND OF THE INVENTION

Capacitors, such as metal oxide semiconductor (MOS) capacitors, are often associated with integrated circuits (ICs) to facilitate the provision of a steady supply of current to one or more parts of the circuit. Capacitors provide a steady supply of current to ICs and mitigate transient currents by, among other things, acting as a charge reservoir that steadily discharges stored current regardless of the transients that the circuit, or parts thereof, are exposed to, such as power to ground noise, for example. Since such capacitors separate or decouple one or more parts of the IC from surrounding noise, they are often referred to as decoupling capacitors.

It can be appreciated that it is generally beneficial to locate a decoupling capacitor as close to the (part of the) IC to be protected as possible. This is particularly true since switching speeds in ICs are continually increasing to allow electronic devices to operate faster and perform more complicated functions, and these increased switching speeds magnify a parasitic inductance within the circuit that inhibits the capacitor's ability to decouple noise and serve a steady supply of current. Additionally, this parasitic inductance generally increases as the decoupling capacitor is moved away from the IC.

Although desirable, it is costly to fabricate MOS capacitors as part of ICs since doing so lengthens and complicates fabrication processes and consumes valuable semiconductor real estate, among other things, for example. As an alternative, decoupling MOS capacitors can be operatively coupled to packaging that surrounds the IC. This, however, increases the cost of packaging and moves the capacitors away from the IC, exacerbating adverse effects associated with parasitic inductance. Accordingly, it would be desirable to be able to fabricate MOS capacitors in a cost effective manner that allows the capacitors to be operatively connected to integrated circuits so that they can serve as decoupling capacitors.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention relates to forming a MOS capacitor in a cost effective manner that allows the capacitor to be operatively coupled to a portion of an integrated circuit so that the capacitor can serve as a decoupling capacitor. According to one or more aspects of the present invention, a method of forming a MOS decoupling capacitor includes patterning a layer of capacitor top electrode material that is formed over a layer of capacitor dielectric material and patterning the layer of capacitor dielectric material which is formed over a semiconductor substrate. A layer of dielectric material is formed over the substrate and the patterned layers of capacitor top electrode and dielectric materials. Vias are then formed within the layer of dielectric material down to the patterned layer of capacitor top electrode material and also down to the substrate. At least one deep contact via that penetrates into the substrate is also formed within the layer of dielectric material. The vias are filled with a conductive material, and a first metallization layer is formed over the layer of dielectric material and the filled vias. The first metallization layer is patterned to form conductive contact pads over the filled vias, and the capacitor is then aligned with an integrated circuit device such that the contact pads of the capacitor are aligned with contact pads of the integrated circuit device. An anneal is performed to fuse the contact pads of the capacitor and the contact pads of the integrated circuit device. Some of the substrate is then removed to expose the at least one deep contact via, and a second metallization layer is formed over the substrate and the at least one deep contact via. The second metallization layer is then patterned to form respective bond pads over the at least one deep contact via.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

One or more aspects of the present invention are described with reference to the drawings, wherein like reference numerals are generally utilized to refer to like elements throughout, and wherein the various structures are not necessarily drawn to scale. It will be appreciated that where like acts, events, elements, layers, structures, etc. are reproduced, subsequent (redundant) discussions of the same may be omitted for the sake of brevity. In the following description, for purposes of explanation, numerous specific details are set forth in order to provide a thorough understanding of one or more aspects of the present invention. It may be evident, however, to one of ordinary skill in the art that one or more aspects of the present invention may be practiced with a lesser degree of these specific details. In other instances, known structures are shown in diagrammatic form in order to facilitate describing one or more aspects of the present invention.

The present invention relates to forming a MOS capacitor that can be utilized as a decoupling capacitor. The capacitor is made in a cost effective manner in that it is fashioned in/on a semiconductor wafer or wafer die that matriculates through a fabrication process tailored to fabricating the capacitor. In particular, the design of the capacitor fabrication process can be tuned or optimized in terms of efficiency. Once fabricated, the MOS capacitor is removed from the wafer or die and operatively coupled to a separately fabricated integrated circuit, which can then proceed for further processing, including packaging. In this manner, the decoupling capacitor can be mounted very close to the circuit device that it is to serve, which allows the capacitor to have a greater impact on the device. Additionally, coupling the capacitor to the IC according to one or more aspects of the present invention does not require valuable semiconductor real estate to be sacrificed.

Figure 1:
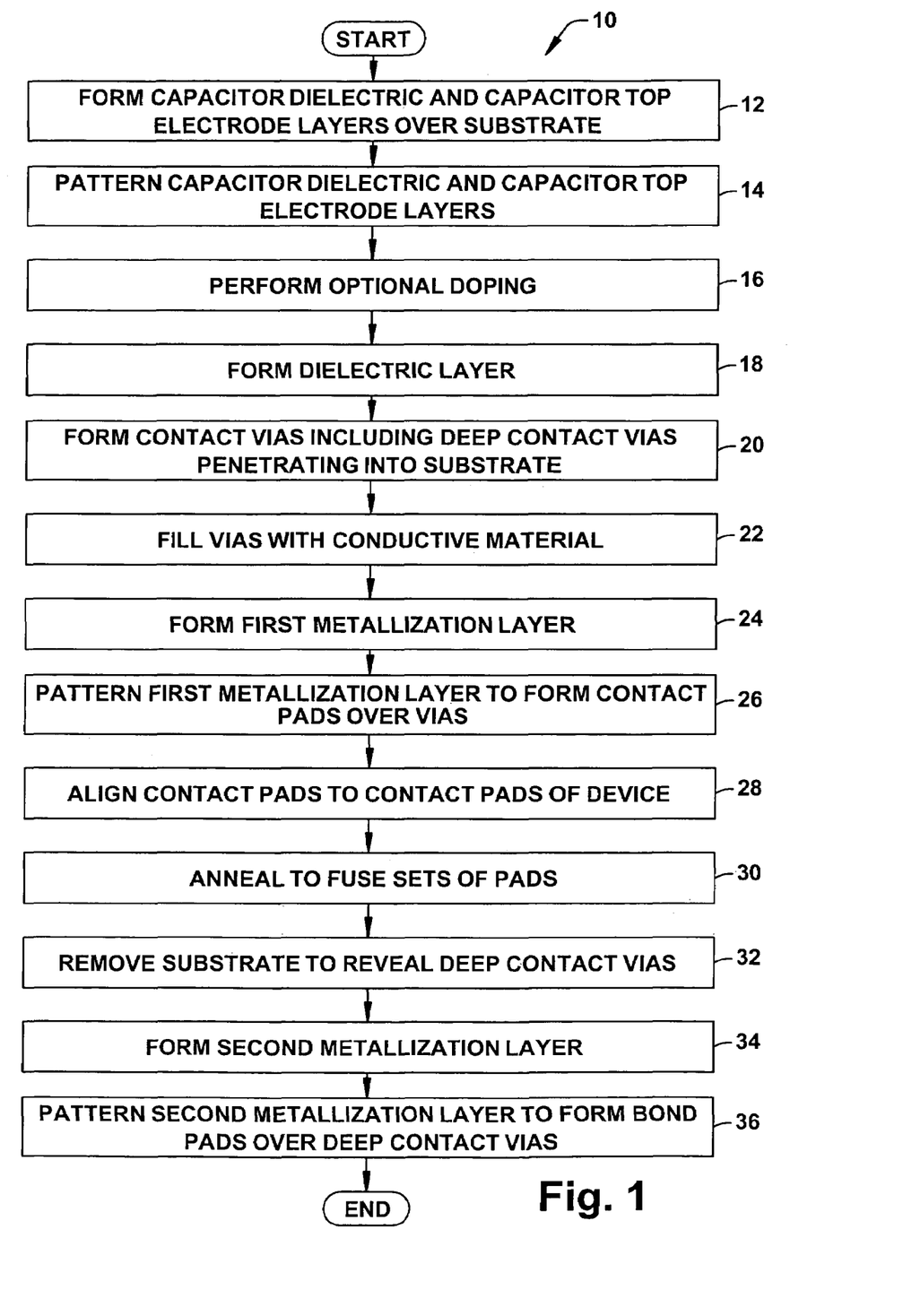
FIG. 1 is a flow diagram illustrating an exemplary methodology for forming a MOS decoupling capacitor in accordance with one or more aspects of the present invention.

Turning to FIG. 1, an exemplary methodology 10 is illustrated for forming a metal oxide semiconductor (MOS) decoupling capacitor according to one or more aspects of the present invention. Although the methodology 10 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases. It will be appreciated that a methodology carried out according to one or more aspects of the present invention may be implemented in association with the formation and/or processing of structures illustrated and described herein as well as in association with other structures not illustrated or described herein.

Figure 2:
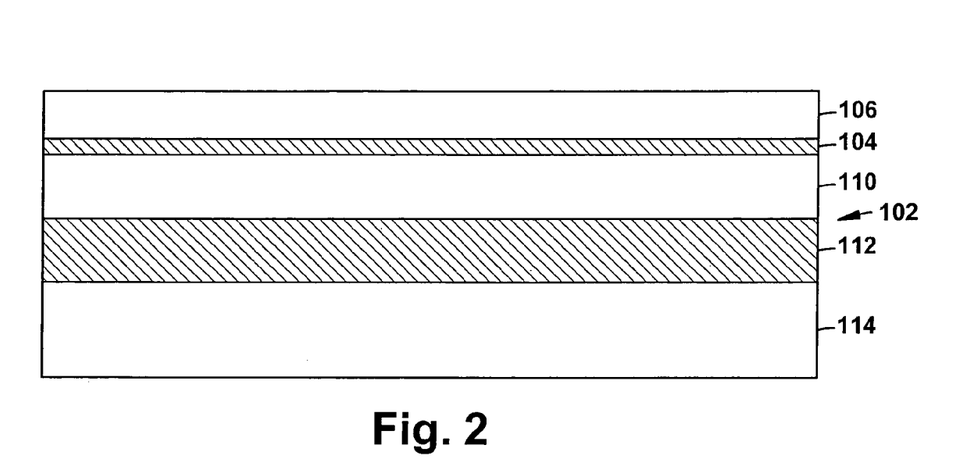
FIGS. 2–13 are cross-sectional illustrations of a MOS decoupling capacitor formed according to one or more aspects of the present invention, such as that set forth in FIG. 1.

The methodology 10 begins at 12 wherein a semiconductor substrate 102 is provided and a layer of capacitor dielectric material 104 is formed there-over, and a layer of capacitor top electrode material 106 is then formed over the layer of capacitor dielectric material 104 (FIG. 2). As with all layers described herein (unless otherwise stated), layers 104 and 106 are substantially conformally formed. Further, it may be desirable at times to form different layers from the same or similar materials so that the layers have similar reactions to subsequent treatments (e.g., etching, CMP). At other times, however, it may be desirable to form different layers from different materials so that they respond differently to subsequent treatments (e.g., have different etch rates).

It is to be appreciated that substrate or semiconductor substrate as used herein can include a base semiconductor wafer or any portion thereof (e.g., one or more wafer die) as well as any epitaxial layers or other type of semiconductor layers formed thereover and/or associated therewith. The substrate can comprise, for example, silicon, SiGe, GaAs, InP and/or SOI. In the illustrated example, the substrate 102 comprises a silicon-on-insulator (SOI) that includes a layer of silicon material 110 overlying a thin layer of an oxide (e.g., $SiO_2$) or other insulator material 112 that overlies a bulk silicon substrate 114. In an SOI arrangement, layer 110 is generally formed to thickness of between about 10 nanometers to about 2 micrometers, while layer 112 is formed to a thickness of between about 100 nanometers to about 1 micrometer, for example.

The layer of capacitor dielectric material 104 can include any of a number of suitable dielectric or non-conductive materials. Some examples include silicon dioxide, high-k dielectric materials, or a stack of such layers. By way of further example, the layer of capacitor dielectric material may include any one or more of the following, either alone or in combination: $SiO_2$, aluminum oxide ($Al_2O_3$), zirconium silicate, hafnium silicate, hafnium silicon oxynitride, hafnium oxynitride, zirconium oxynitride, zirconium silicon oxynitride, hafnium silicon nitride, lanthanum oxide ($La_2O_3$), hafnium oxide ($HfO_2$), zirconium oxide ($ZrO_2$), cerium oxide ($CeO_2$), bismuth silicon oxide ($Bi_4Si_2O_{12}$), titanium dioxide ($TiO_2$), tantalum oxide ($Ta_2O_5$), tungsten oxide ($WO_3$), yttrium oxide ($Y_2O_3$), lanthanum aluminum oxide ($LaAlO_3$), barium strontium titanate, barium strontium oxide, barium titanate, strontium titanate, $PbZrO_3$, PST, PZN, PZT and PMN. The layer of capacitor dielectric material 104 can be formed to a thickness of about 1 nanometer or more, and can have an equivalent oxide thickness (EOT) of about 1 nanometer or less, for example, while the layer of capacitor top electrode material 106 can be formed to a thickness of between about 50 to about 200 nanometers, for example. The top electrode layer 106 generally includes polysilicon, SiGe and/or metal (e.g., TiN, Ta, TaN, W).

Figure 3:
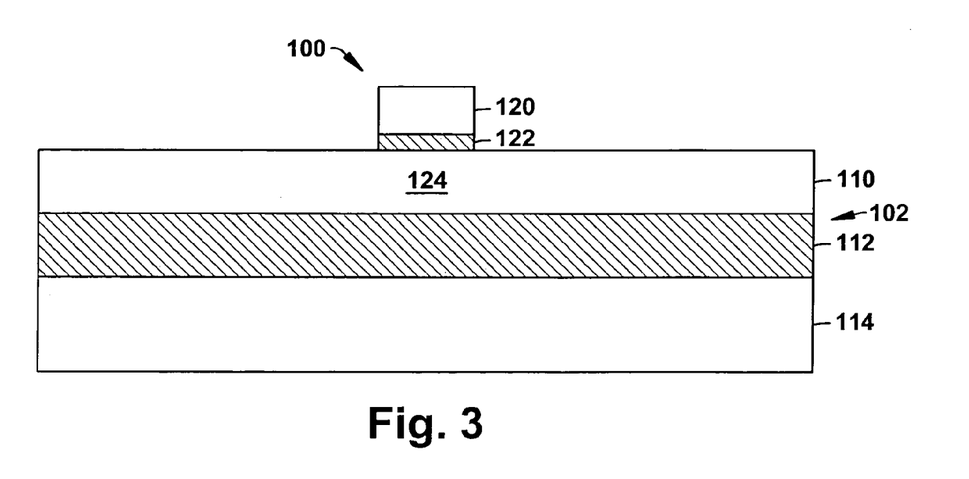

The methodology 10 then advances to 14 wherein the layer of capacitor top electrode material 106 and the layer of capacitor dielectric material 104 are patterned to establish a capacitor top electrode 120 and a capacitor dielectric 122, respectively (FIG. 3). Generally, the layer of capacitor top electrode material 106 is patterned first and the layer of capacitor dielectric material 104 becomes at least partially patterned as part of this process. For example, an etchant utilized to pattern the layer of capacitor top electrode material 106 may also remove some of the layer of capacitor dielectric material 104. Similarly, clean up steps associated with patterning the layer of capacitor top electrode material 106 as well as clean up steps associated with a hard mask removal process may also remove some of the layer of gate capacitor dielectric material 104. It will be appreciated that the substrate 102 may comprise an n type or a p type material (e.g., p+ or n+) that is electrically conductive. In such an arrangement, the substrate 102 serves as a bottom electrode 124 for the MOS capacitor 100.

As with all layers described herein (unless specifically indicated otherwise), layers 104 and 106 can be patterned in any suitable manner, such as via etching and/or lithographic techniques. Lithography refers to processes for transferring one or more patterns between various media. In lithography, a radiation sensitive resist coating is formed over one or more layers to which a pattern is to be transferred. The resist, which sometimes referred to as a photoresist, is itself first patterned by exposing it to radiation, where the radiation (selectively) passes through an intervening mask containing the pattern. As a result, the exposed or unexposed areas of the resist coating become more or less soluble, depending on the type of resist used. A developer is then used to remove the more soluble areas leaving the patterned resist. The pattered resist can then serve as a mask for the underlying layers which can be selectively etched to transfer the pattern thereto.

Figure 4:
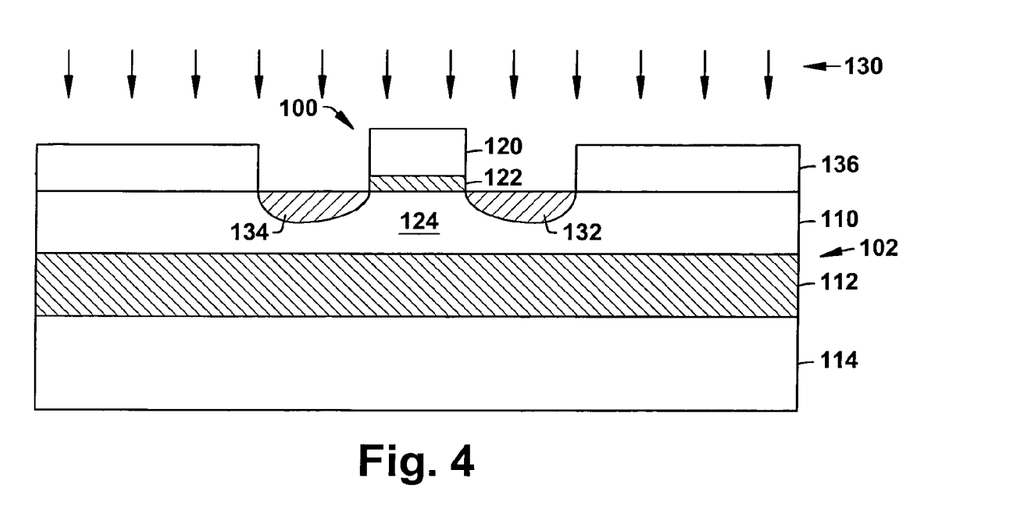

It will be appreciated that the semiconductor substrate 102 can also be treated to establish more heavily doped regions therein. As such, after the layer of capacitor top electrode material 106 and the layer of capacitor dielectric material 104 are patterned, the methodology 10 advances to 16 wherein the substrate 102 can be optionally doped (FIG. 4). In particular, a dopant material 130 can be selectively applied to areas of the substrate 102 to form more heavily doped regions 132, 134 therein. The dopant 130 can be selectively applied with the assistance of a layer of masking material 136 (e.g., a photoresist) that is formed over the substrate 102 and patterned. The dopant 130 is substantially blocked by the patterned masking material 136 and, thus, merely affects exposed regions of the substrate 102 (and optionally the capacitor top electrode 120—depending upon the patterning of the layer of masking material 136). The dopant 130 alters the electrical properties of affected regions 132, 134 so that they can serve as bottom electrodes of the MOS capacitor. It will be appreciated that the substrate 102 can be doped with any suitable dopant 130 to instill desired electrical properties within the substrate. For example, if the substrate 102 initially comprises a p type material, then the dopant 130 may be a p type dopant that can be applied to the substrate in such a quantity and/or for such a duration that the regions 132, 134 become p+ type regions. Such doped regions 132, 134 generally extend to respective depths of between about 10 nanometers to about 500 nanometers, for example, in the substrate 102.

Figure 5:
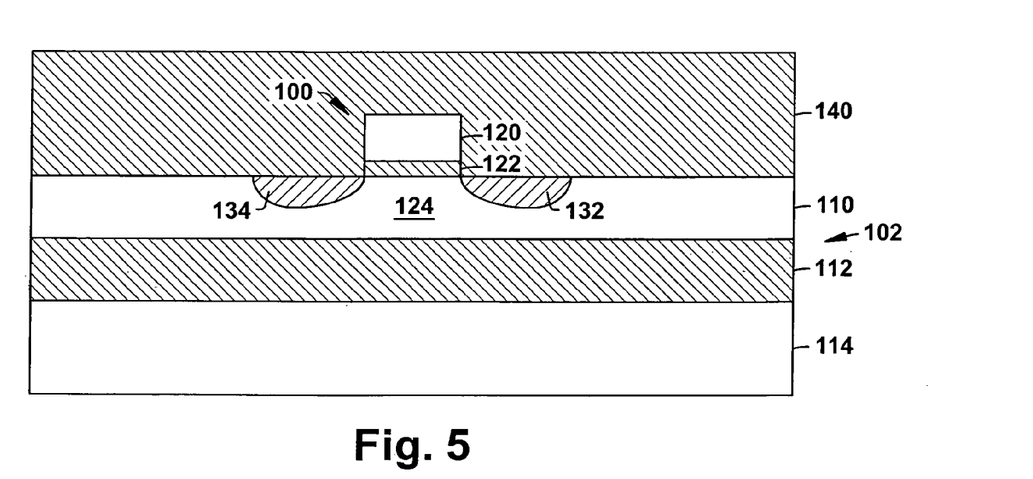

A layer of dielectric material 140 is then formed over the substrate 102, capacitor top electrode 120 and capacitor dielectric 122 at 18 (FIG. 5). In the event that more heavily doped regions 132, 134 are formed in the substrate 102 as in the illustrated example, it will be appreciated that the patterned masking material 136 is removed prior to forming the layer of dielectric material 140. The layer of dielectric material 140 can comprise any suitable non-conductive material(s) such as those listed above regarding the layer of capacitor dielectric material 104, and can be formed to a thickness of between about 500 nanometers to about 5 micrometers, for example.

Figure 6:
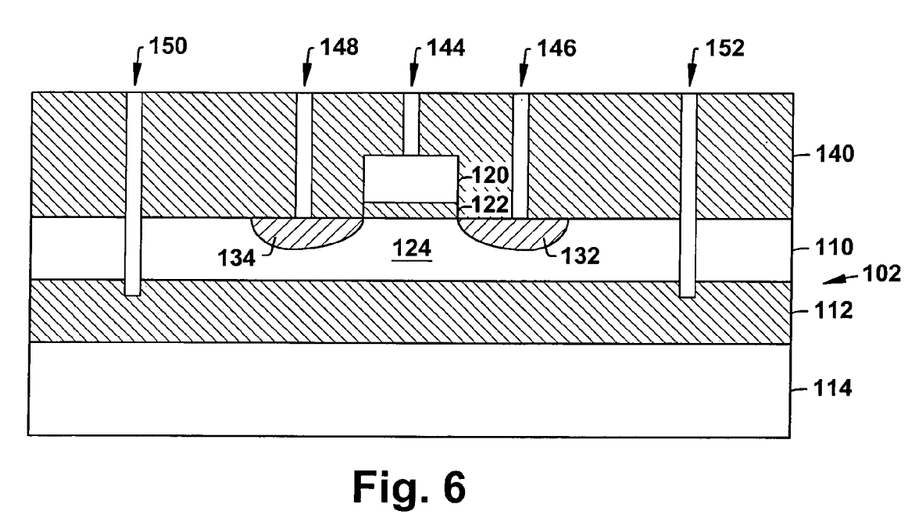

At 20, vias are formed (e.g., etched) within the layer of dielectric material 140 (FIG. 6). Although not shown, it will be appreciated that the vias can be formed by etching the layer of dielectric material 140 with the assistance of a patterned mask (e.g., a lithographically patterned photoresist). In the illustrated example, one via 144 is formed down to the capacitor top electrode 120, while respective vias 146, 148 are formed down to the doped regions 132 and 134, and deep contact vias 150, 152 are formed into the substrate 102 (e.g., by etching and photolithography). It will be appreciated that the vias facilitate forming electrical contacts down to the various areas of the capacitor 100 and substrate 102, and that any suitable number of vias can be formed according to one or more aspects of the present invention. For example, if regions 132, 134 are not established with the substrate 102 so that an n type or p type substrate 102 serves as the bottom electrode 124 of the capacitor 100, a single via (e.g., 146 or 148) may be formed down to the substrate 102 to allow an electrical contact to be made to this bottom electrode 124. Further, deep contact vias, such as vias 150, 152, are generally formed to a depth of between about 10 to about 20 micrometers, and can be made relatively large in diameter to mitigate development of unwanted resistance. It will also be appreciated that where the substrate 102 comprises an SOI, as in the illustrated example, that deep contact vias, such as vias 150, 152, are formed through the layer of silicon material 110 of the substrate 102 and down into the layer of insulator material 112. Nitride etch stopping layers can be used, for example, where a first masking layer is employed to define the vias 144, 146, 148 to the capacitor top electrode 120 and doped regions 132, 134, respectively, and a second masking layer is employed to define the deep contact vias 150, 152. Alternatively, the vias can be formed substantially concurrently depending upon etch selectivity.

Figure 7:
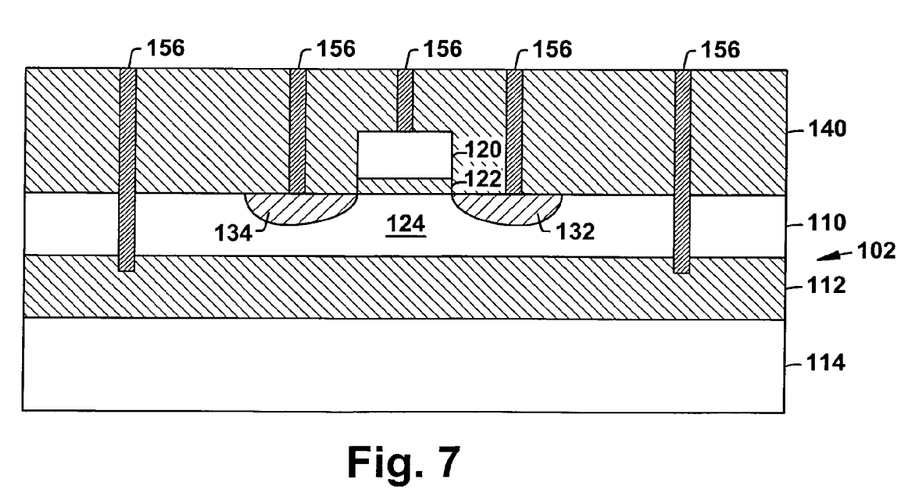
Figure 8:
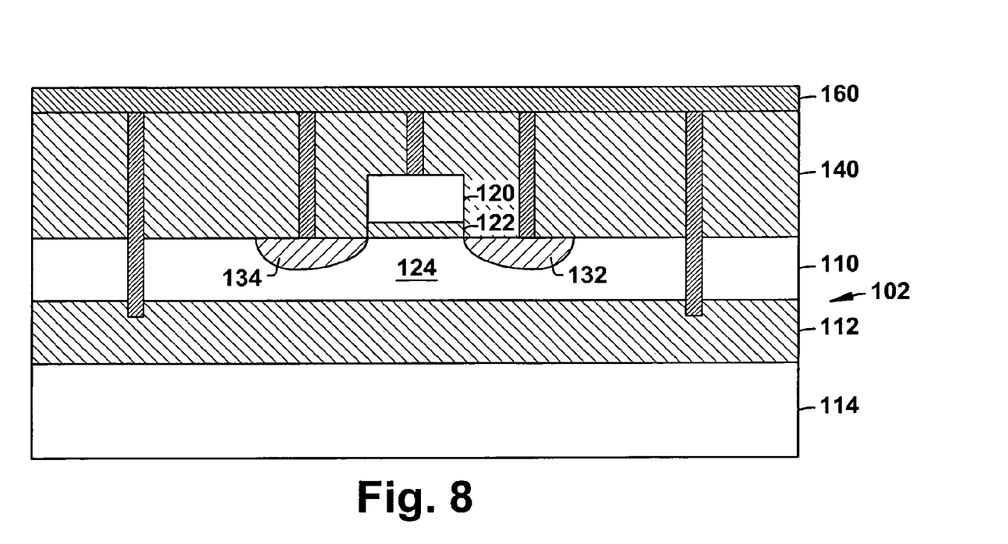
Figure 9:
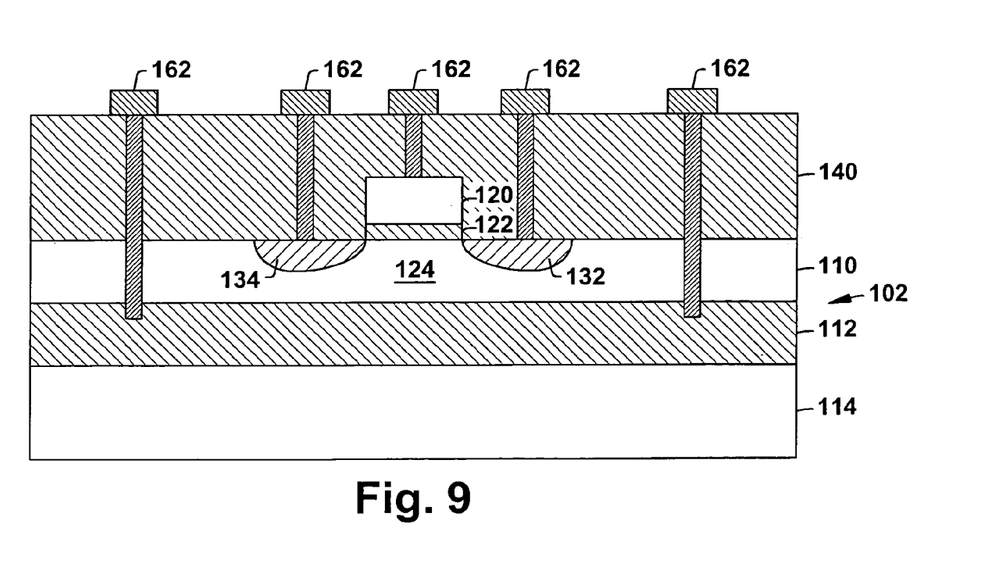

After the vias are formed at 20, the methodology 10 advances to 22 where they are filled with a conductive material 156 such as tungsten, for example (FIG. 7). The conductive material can be added to the vias in any suitable manner, such as by chemical vapor deposition, for example. A layer of conductive material 160, such as copper, for example, is then formed over the dielectric layer 140 and filled vias 156 at 24 (FIG. 8). The layer of conductive material 160 is generally formed to a thickness of between about 100 nanometers to about 1 micrometer, for example. The layer of conductive material 160 is then patterned over the conductive vias 156 (e.g., with etching and photolithography) to form conductive contact pads 162 over the filled vias at 26 (FIG. 9). The contact pads 162 of the capacitor 100 are generally between about 15 by 15 square micrometers to about 100 by 100 square micrometers in size.

Figure 10:
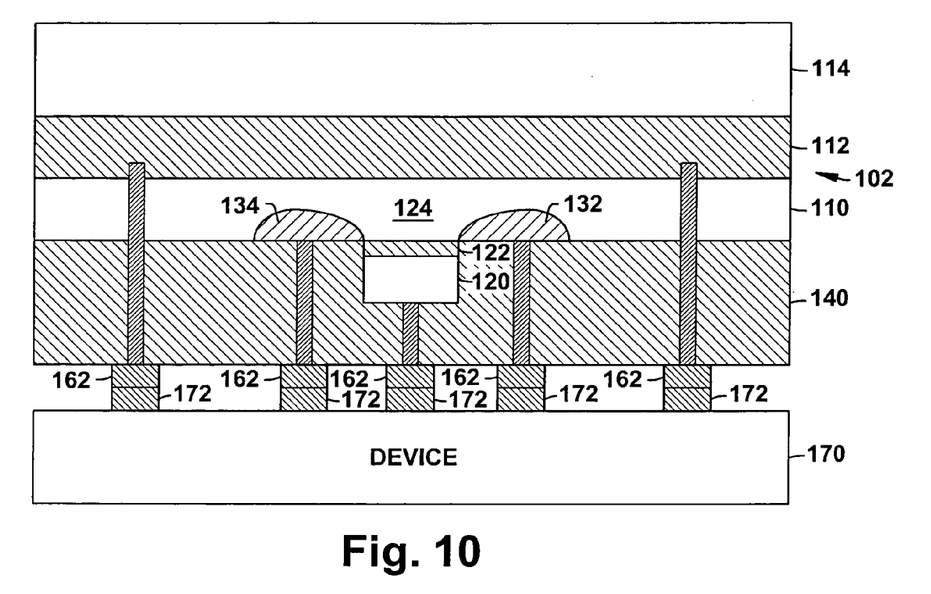
Figure 11:
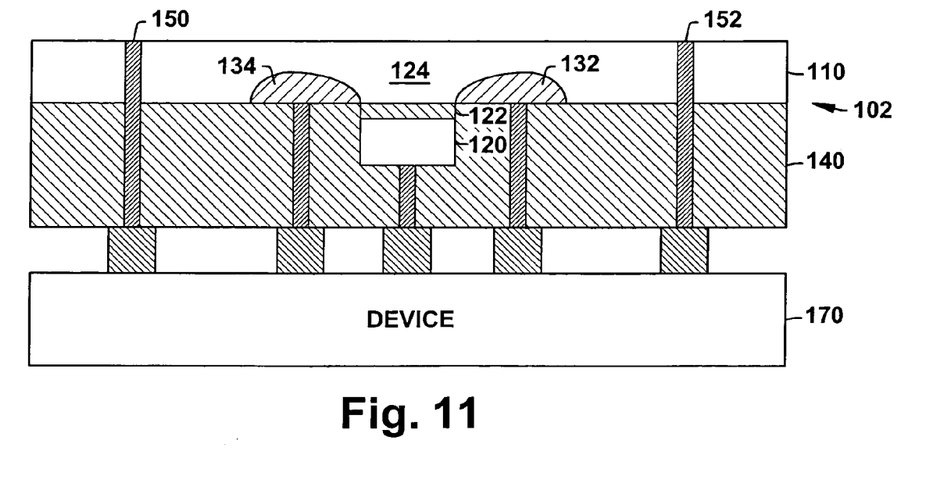

At 28, the capacitor 100 is aligned (e.g., with optical and/or infrared techniques) with the particular integrated circuit device 170 for which the capacitor is to serve as a decoupling capacitor (FIG. 10). In particular, the contact pads 162 of the capacitor 100 are aligned with contact pads 172 of the integrated circuit device 170, and an anneal is performed at 30 (e.g., at a temperature of between about 350 to about 500 degrees Celsius) to fuse the contact pads 162 of the capacitor 100 and the contact pads 172 of the integrated circuit device 170 (FIG. 11). It will be appreciated that the capacitor 100 is generally inverted relative to the circuit device 170 to align the pads 162 and 172. It can be appreciated that this arrangement conserves valuable semiconductor real estate as the capacitor 100 is not formed adjacent to the integrated circuit device 170 on the same semiconductor substrate that the circuit device 170 is formed upon. As such, the integrated circuit 170 can be fashioned in an area efficient manner on a semiconductor substrate while the MOS capacitor 100 can likewise be fashioned upon a semiconductor substrate in a fabrication process that is tuned to efficiently form the capacitor 100. It will also be appreciated that the MOS capacitor 100 may be removed (e.g., cut) from a semiconductor wafer or die (e.g., upon which multiple decoupling capacitors are formed) before being annealed to the circuit device 170.

At 32, some of the substrate 102 is removed to expose the one or more filled deep contact vias 150, 152 (FIG. 11). It will be appreciated that the substrate 102 can be removed in any suitable manner, such as by back-grinding, etching, washing, etc., for example. Where the substrate 102 comprises an SOI, for example, back-grinding can be employed to remove the bulk silicon substrate 114 followed by a wet etch to remove the layer of insulator material 112. About 10 to about 15 micrometers of the filled deep contact vias 150, 152 generally remains after removing some of the substrate 102.

Figure 12:
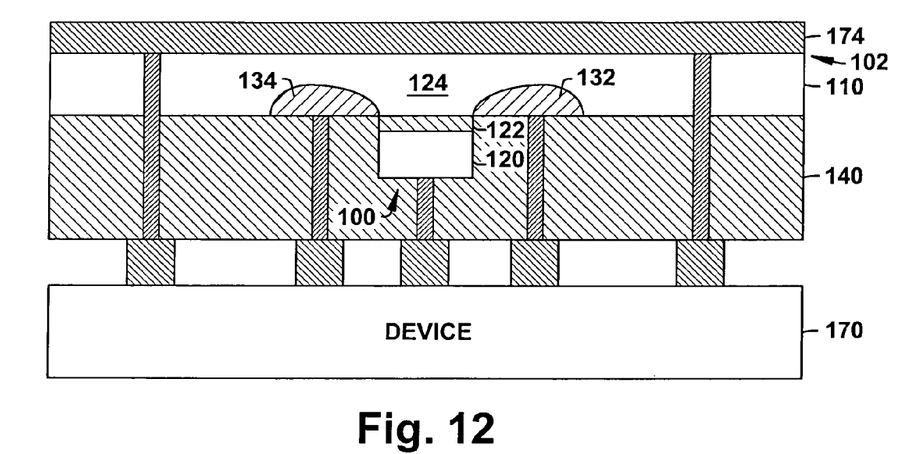
Figure 13:
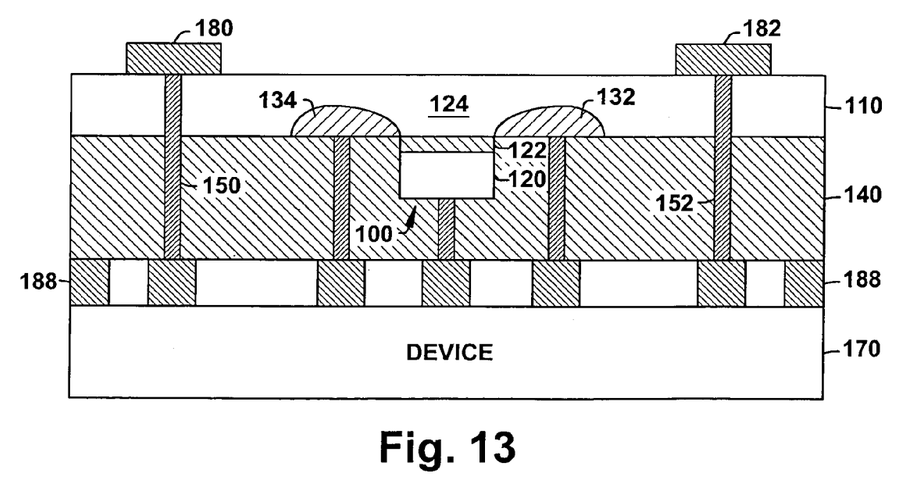

A second layer of metallization 174 is then formed over the exposed surface of the substrate 102 and filled deep contact vias 150, 152 at 34 (FIG. 12). The second layer of metallization 174 can comprise any suitable electrically conductive materials, such as aluminum, for example. At 36, the second layer of metallization 174 is patterned to form respective bond pads 180, 182 over at least one of the filled deep contact vias 150, 152 (FIG. 13). The methodology 100 can then continue on for further processing, such as packaging of the circuit device 170 and the operatively coupled MOS decoupling capacitor 100. It will be appreciated that the bond pads 180, 182 (e.g., bump or flip chip or wire bonds) provide a means for electrically coupling the capacitor 100 and associated device 170 to the outside world. It will also be appreciated that additional "dummy" pads can respectively be formed on the capacitor 100 and device 170, and that these pads can be fused to provide mechanically strengthening bonds 188 (FIG. 13).

One or more aspects of the present invention thus allow a capacitor that can be customized for a particular application/circuit device to be produced in a cost effective manner, including reducing the cost of packaging since no additional parts or assembly are needed on the package. The capacitor and fabrication process can be customized and optimized, for example, in terms of cost, yield, capacitance/unit area, leakage, current, voltage, frequency, power, inductance, etc. depending upon circuit requirements, as well as the number and location of contact pads that allow the capacitor to be operatively connected to the circuit device in a stable manner. Additionally, since MOS capacitors can be made from an entire wafer, they can be made relatively large without having adverse implications on the area of the IC. The decoupling capacitor can thus be fabricated using a standard metal oxide semiconductor (MOS) process flow, but with the addition of a deep contact, where the capacitor can be NMOS, PMOS, NMOS in Nwell, or PMOS in Pwell.

It will be appreciated that while reference is made throughout this document to exemplary structures in discussing aspects of methodologies described herein (e.g., those structures presented in FIGS. 2–13 while discussing the methodology set forth in FIG. 1), that those methodologies are not to be limited by the corresponding structures presented. Rather, the methodologies (and structures) are to be considered independent of one another and able to stand alone and be practiced without regard to any of the particular aspects depicted in the Figs.

Further, from time to time throughout this specification and the claims that follow, one or more layers or structures may be described as being or containing a substance such as "tungsten", "copper", "silicon nitride", etc. These description are to be understood in context and as they are used in the semiconductor manufacturing industry. For example, in the semiconductor industry, when a metallization layer is described as containing copper, it is understood that the metal of the layer comprises pure copper as a principle component, but the pure copper may be, and typically is, alloyed, doped, or otherwise impure. As another example, silicon nitride may be a silicon rich silicon nitride or an oxygen rich silicon nitride. Silicon nitride may contain some oxygen, but not so much that the material's dielectric constant is substantially different from that of high purity stoichiometric silicon nitride.

Although one or more aspects of the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and/or advantageous for any given or particular application. Furthermore, to the extent that the terms "includes", "having", "has", "with", or variants thereof are used in either the detailed description or the claims, such terms are intended to be inclusive in a manner similar to the term "comprising."

Also, the term "exemplary" is merely meant to mean an example, rather than the best. It is also to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein. Additionally, unless stated otherwise and/or specified to the contrary, any one or more of the layers set forth herein can be formed in any number of suitable ways, such as with spin-on techniques, sputtering techniques (e.g., magnetron and/or ion beam sputtering), (thermal) growth techniques and/or deposition techniques such as chemical vapor deposition (CVD), physical vapor deposition (PVD) and/or plasma enhanced chemical vapor deposition (PECVD), or atomic layer deposition (ALD), for example.

What is claimed is:

1. A method of forming a MOS decoupling capacitor, comprising:
   patterning a layer of capacitor top electrode material formed over a layer of capacitor dielectric material;
   patterning the layer of capacitor dielectric material that is formed over a semiconductor substrate;
   forming a layer of dielectric material over the substrate and patterned layers of capacitor top electrode and dielectric materials;
   forming vias within the layer of dielectric material down to the patterned layer of capacitor top electrode material and down to the substrate, including forming at least one deep contact via that penetrates into the substrate;
   filling the vias with a conductive material;
   forming a first metallization layer over the layer of dielectric material and filled vias;
   patterning the first metallization layer to form conductive contact pads over the filled vias;
   aligning the capacitor with an integrated circuit device such that the contact pads of the capacitor are aligned with contact pads of the integrated circuit device;
   performing an anneal to fuse the contact pads of the capacitor and the contact pads of the integrated circuit device;
   removing some of the substrate to expose the at least one deep contact via;
   forming a second metallization layer over the substrate and the at least one deep contact via; and
   patterning the second metallization layer to form respective bond pads over the at least one deep contact via.

2. The method of claim 1, wherein removing some of the substrate comprises back-grinding the substrate to expose the at least one deep contact via.

3. The method of claim 2, wherein the substrate is an SOI comprising a layer of silicon material overlying a layer of an insulator material that overlies a bulk silicon substrate, wherein the at least one deep contact via penetrates through the layer of silicon material and into the layer of insulator material.

4. The method of claim 2, wherein the substrate is an SOI comprising a layer of silicon material overlying a layer of an insulator material that overlies a bulk silicon substrate, wherein the at least one deep contact via penetrates through the layer of silicon material and into the layer of insulator material, the method further comprising performing a wet etch to remove the layer of insulator material after back-grinding away the bulk silicon substrate.

5. The method of claim 1, further comprising:
   selectively doping regions of the substrate adjacent to the patterned capacitor top electrode and capacitor dielectric layers before forming the layer of dielectric material.

6. The method of claim 5, wherein at least one of the vias is formed down to the doped regions of the substrate.

7. The method of claim 1, wherein the contact pads of the capacitor and the contact pads of the integrated circuit device comprise similar materials.

8. The method of claim 7, wherein the contact pads of the capacitor and the contact pads of the integrated circuit device comprise copper.

9. The method of claim 1, wherein the at least one deep contact via is formed to a depth of between about 10 to about 20 micrometers.

10. The method of claim 9, wherein the at least one deep contact via has a depth of between about 10 to about 15 micrometers after being exposed by removal of some of the substrate.

11. A method of forming a MOS decoupling capacitor, comprising:
    patterning a layer of capacitor top electrode material formed over a layer of capacitor dielectric material;
    patterning the layer of capacitor dielectric material that is formed over a semiconductor substrate;
    selectively doping regions of the substrate adjacent to the patterned capacitor top electrode and capacitor dielectric layers;
    forming a layer of dielectric material over the substrate and patterned layers of capacitor top electrode and dielectric materials;
    forming vias within the layer of dielectric material down to the patterned layer of capacitor top electrode material and down to the doped regions of the substrate, including forming at least one deep contact via that penetrates into the substrate;
    filling the vias with a conductive material;
    forming a first metallization layer over the layer of dielectric material and filled vias;
    patterning the first metallization layer to form conductive contact pads over the filled vias;
    aligning the capacitor with an integrated circuit device such that the contact pads of the capacitor are aligned with contact pads of the integrated circuit device;
    performing an anneal to fuse the contact pads of the capacitor and the contact pads of the integrated circuit device;
    removing some of the substrate to expose the at least one deep contact via;
    forming a second metallization layer over the substrate and the at least one deep contact via; and
    patterning the second metallization layer to form respective bond pads over the at least one deep contact via.

12. The method of claim 11, wherein removing some of the substrate comprises back-grinding the substrate to expose the at least one deep contact via.

13. The method of claim 12, wherein the substrate is an SOI comprising a layer of silicon material overlying a layer of an insulator material that overlies a bulk silicon substrate, wherein the at least one deep contact via penetrates through the layer of silicon material and into the layer of insulator material.

14. The method of claim 12, wherein the substrate is an SOI comprising a layer of silicon material overlying a layer of an insulator material that overlies a bulk silicon substrate, wherein the at least one deep contact via penetrates through the layer of silicon material and into the layer of insulator material, the method further comprising performing a wet etch to remove the layer of insulator material after back-grinding away the bulk silicon substrate.

15. The method of claim 11, wherein at least one of the anneal is performed at a temperature of between about 350 to about 500 degrees Celsius, the substrate is a p+ or n+ type substrate and the respective bond pads comprise aluminum.

16. The method of claim 11, wherein the contact pads of the capacitor are between about 15 by 15 square micrometers to about 100 by 100 square micrometers in size.

17. The method of claim 11, wherein the contact pads of the capacitor and the contact pads of the integrated circuit device comprise similar materials.

18. The method of claim 17, wherein the contact pads of the capacitor and the contact pads of the integrated circuit device comprise copper.

19. The method of claim 11, wherein the at least one deep contact via is formed to a depth of between about 10 to about 20 micrometers.

20. The method of claim 19, wherein the at least one deep contact via has a depth of between about 10 to about 15 micrometers after being exposed by removal of some of the substrate.

* * * * *